(12) United States Patent
Lee et al.

(10) Patent No.: US 9,214,451 B2
(45) Date of Patent: Dec. 15, 2015

(54) SEMICONDUCTOR CHIP INCLUDING A SPARE BUMP AND STACKED PACKAGE HAVING THE SAME

(71) Applicant: SK hynix Inc., Incheon-si Gyeonggi-do (KR)

(72) Inventors: Sang Eun Lee, Icheon-si (KR); Chang Il Kim, Busan (KR)

(73) Assignee: Sk Hynix Inc., Gyeonggi-do (KR)

( * ) Notice: Subject to any disclaimer, the term of this patent is extended or adjusted under 35 U.S.C. 154(b) by 91 days.

(21) Appl. No.: 14/179,842

(22) Filed: Feb. 13, 2014

(65) Prior Publication Data
US 2015/0084689 A1 Mar. 26, 2015

(30) Foreign Application Priority Data

Sep. 26, 2013 (KR) .................. 10-2013-0114175

(51) Int. Cl.
| H01L 25/00 | (2006.01) |
| H01L 25/065 | (2006.01) |
| G11C 29/02 | (2006.01) |
| H01L 23/00 | (2006.01) |
| G11C 29/44 | (2006.01) |

(52) U.S. Cl.
CPC .......... *H01L 25/0657* (2013.01); *G11C 29/025* (2013.01); *H01L 24/14* (2013.01); *G11C 2029/4402* (2013.01); *H01L 24/13* (2013.01); *H01L 24/16* (2013.01); *H01L 24/17* (2013.01); *H01L 2224/13025* (2013.01); *H01L 2224/14515* (2013.01); *H01L 2224/16146* (2013.01); *H01L 2224/17181* (2013.01); *H01L 2225/06513* (2013.01); *H01L 2225/06527* (2013.01); *H01L 2225/06541* (2013.01); *H01L 2225/06544* (2013.01); *H01L 2225/06565* (2013.01); *H01L 2924/37001* (2013.01)

(58) Field of Classification Search
USPC .................................. 327/524–602
See application file for complete search history.

(56) References Cited

U.S. PATENT DOCUMENTS

| 5,360,988 | A | * | 11/1994 | Uda et al. ...................... 257/529 |
| 5,434,513 | A | * | 7/1995 | Fujii et al. ................ 324/754.07 |
| 5,995,379 | A | * | 11/1999 | Kyougoku et al. ........... 361/803 |
| 7,666,690 | B2 | * | 2/2010 | Lee et al. ........................... 438/4 |
| 8,017,999 | B2 | * | 9/2011 | Suzuki ........................... 257/355 |
| 2005/0116331 | A1 | * | 6/2005 | Tsunozaki ................... 257/686 |
| 2006/0170112 | A1 | * | 8/2006 | Tanaka et al. ................. 257/777 |
| 2008/0157076 | A1 | * | 7/2008 | Jeong .............................. 257/48 |
| 2009/0219069 | A1 | * | 9/2009 | Shinozaki et al. ............ 327/158 |
| 2011/0093235 | A1 | * | 4/2011 | Oh et al. ....................... 702/120 |
| 2011/0304364 | A1 | * | 12/2011 | Yoo et al. ..................... 327/147 |

(Continued)

*Primary Examiner* — Brandon S Cole
(74) *Attorney, Agent, or Firm* — William Park & Associates Ltd.

(57) ABSTRACT

A stacked package including: a semiconductor substrate, a circuit layer formed over the semiconductor substrate, a bump formed over the circuit layer, a spare bump formed correspondingly to the bump and over the circuit layer, and configured for replacing the bump with the spare bump, a through electrode configuring to pass through the semiconductor substrate on a same line as the bump and electrically coupled the bump or the spare bump in response to a selection signal, and a spare through electrode configured to pass through the semiconductor substrate on a same line as the spare bump and electrically coupled with the bump or the spare bump in response to a selection signal. When a bump has failed, a vertical input/output line of the semiconductor chips is established by a spare bump corresponding to the failed bump through the selective signal routing.

17 Claims, 13 Drawing Sheets

(56) References Cited

U.S. PATENT DOCUMENTS

| | | | |
|---|---|---|---|
| 2012/0133427 A1* | 5/2012 | Kim et al. | 327/564 |
| 2014/0210497 A1* | 7/2014 | Endo | 324/750.3 |
| 2015/0002183 A1* | 1/2015 | Bode | 324/762.02 |

* cited by examiner

SEMICONDUCTOR CHIP INCLUDING A SPARE BUMP AND STACKED PACKAGE HAVING THE SAME

CROSS-REFERENCES TO RELATED APPLICATIONS

The present application claims priority under 35 U.S.C. 119(a) to Korean patent application number 10-2013-0114175 filed on Sep. 26, 2013, in the Korean Intellectual Property Office, which is incorporated herein by reference in its entirety.

BACKGROUND

1. Technical Field

The disclosure generally relates to a semiconductor technology, and more particularly, to a semiconductor chip including a spare bump and a stacked package having the same.

2. Related Art

In the semiconductor industry, packaging technologies for integrated circuits have continuously been developed to satisfy the demands toward miniaturization and mounting reliability. In recent years, as miniaturization and high performance are demanded in electric and electronic products, various stacking techniques have been developed.

The term "stack" as used in the semiconductor industry means to pile vertically two or more semiconductor chips or semiconductor packages. With these stacking technologies, a memory element may have a memory capacity two or more times greater than that obtainable through semiconductor integration process. Besides the increased memory capacity, the stacked packages also have advantages in terms of mounting density and efficient utilization of a mounting area. For these reasons, research and development for stacked packages have been accelerated.

As an example of a stacked package, a stacked package has been introduced in which through electrodes and bumps are formed such that upper and lower semiconductor chips are electrically connected with one another by the through electrodes and bumps. The stacked package has an advantage in that high operation speed and miniaturization can be achieved since signals are transferred through vertical input/output lines formed by the through electrodes and bumps.

SUMMARY

Various embodiments are generally directed to a semiconductor chip capable of improving yield and a stacked package having the same.

In an embodiment of the present disclosure, a semiconductor chip includes: a semiconductor substrate, a circuit layer formed over the semiconductor substrate, a bump formed over the circuit layer, a spare bump formed correspondingly to the bump and over the circuit layer, and configured for replacing the bump with the spare bump, a through electrode configured to pass through the semiconductor substrate on a same line as the bump and electrically couple with the bump or the spare bump in response to a selection signal, and a spare through electrode configured to pass through the semiconductor substrate on a same line as the spare bump and electrically couple with the spare bump or the bump in response to the selection signal.

In an embodiment of the present disclosure, a stacked package includes: a plurality of semiconductor chips having a semiconductor substrate, a circuit layer formed over the semiconductor substrate, a bump formed over the circuit layer, a spare bump formed correspondingly to the bump and over the circuit layer and configured for replacing the bump with the spare bump, a through electrode configured to pass through the semiconductor substrate on a same line as the bump and electrically couple with the bump or the spare bump by selective signal routing, and a spare through electrode configured to pass through the semiconductor substrate on a same line as the spare bump and electrically couple with the bump or the spare bump by selective signal routing, wherein when a bump fails, a vertical input/output line of the semiconductor chips is established by a spare bump corresponding to the failed bump through the selective signal routing.

In an embodiment of the present disclosure, a electronic system includes: a memory, and a controller configured to communicate with the memory through a bus, wherein the memory includes a stacked package, comprising: a plurality of semiconductor chips having a semiconductor substrate, a circuit layer formed over the semiconductor substrate, a bump formed over the circuit layer, a spare bump formed correspondingly to the bump and over the circuit layer and configured for replacing the bump with the spare bump, a through electrode configured to pass through the semiconductor substrate on a same line as the bump and electrically couple with the bump or the spare bump by selective signal routing, and a spare through electrode configured to pass through the semiconductor substrate on a same line as the spare bump and electrically couple with the bump or the spare bump by selective signal routing, wherein when a bump fails, a vertical input/output line of the semiconductor chips is established by a spare bump corresponding to the failed bump through the selective signal routing.

DETAILED DESCRIPTION

Hereafter, various embodiments of the present disclosure will be described in detail with reference to the accompanying drawings.

Figure 1:
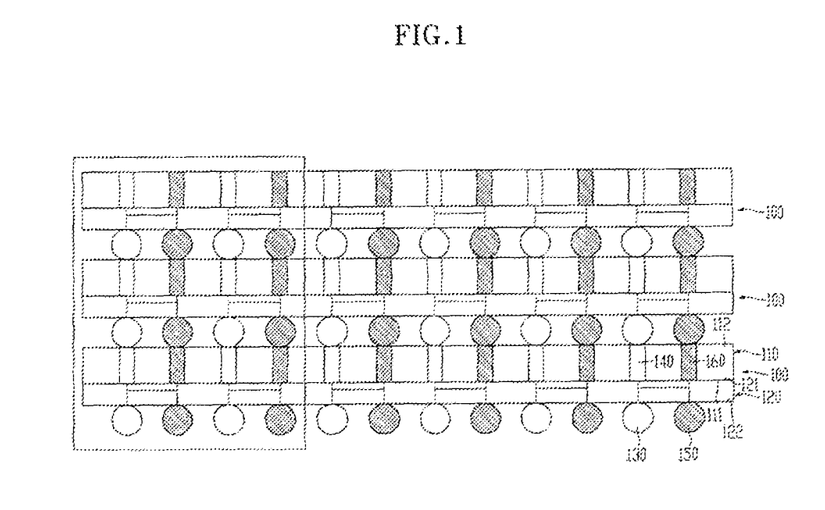
FIG. 1 is a cross-sectional view illustrating a stacked package in accordance with an embodiment of the present disclosure.

Referring to FIG. 1, a stacked package in accordance with an embodiment of the present disclosure includes a plurality of semiconductor chips 100 stacked over one another. For example, the stacked package in accordance with the present embodiment includes three semiconductor chips 100 stacked over one another.

Though the present embodiment is described and shown for a case where three semiconductor chips are stacked, the present disclosure is not particularly limited to the case where the number of the stacked semiconductor chips is three.

Each of the semiconductor chips 100 may include a semiconductor substrate 110 and a circuit layer 120.

The semiconductor substrate 110 has a first surface 111 and a second surface 112 which is opposite to the first surface 111. The circuit layer 120 has a first surface 121 which is in contact with the first surface 111 of the semiconductor substrate 110 and a second surface 122 which is opposite to the first surface 121. The semiconductor substrate 110 may be formed of silicon and the circuit layer 120 may be formed with an integrated circuit (not shown) in accordance with chip design.

The circuit layer 120 is formed with a plurality of bumps 130 over the second surface 122 thereof and the semiconductor substrate 110 is formed with a plurality of through electrodes 140 that pass through the first and second surfaces 111 and 112 along the same vertical lines as the respective bumps 130. The through electrodes 140 may be formed by forming via holes that pass through the semiconductor substrate 110 and filling conductive material, e.g. copper in the via holes. Each of the through electrodes 140 can be electrically connected with the bump 130, which is formed on the same vertical line as the corresponding through electrode, through signal routing.

The semiconductor chips 100 are stacked such that their bumps and through electrodes are connected with each other. Signal transfer between the stacked semiconductor chips 100 are performed through vertical input/output lines formed by the through electrodes 140 and bumps 130. Various signals required for the chip operation including data, addresses, commands, clocks and powers, e.g. VDD, VCC and VSS may be transferred through the vertical input/output lines.

A fail bump may be present among the bumps 130 of the stacked semiconductor chips 100. In this case, the corresponding vertical input/output line is also failed and thus the stacked package cannot be used. Accordingly, it is necessary to perform a bump test prior to stacking of the semiconductor chip 100 and discard the semiconductor chip 100 having a fail bump. However, the semiconductor chip 100 is formed with a plurality of bumps 130 and failure in any of the plurality of the bumps 130 makes the semiconductor chip 100 unserviceable and discarded, resulting in a large decrease in yield.

In order to solve the above problem, each of the semiconductor chips 100 is provided with a plurality of spare bumps 150 for replacing the bumps 130 over the second surface 122 of the circuit layer 120. Each of the semiconductor chips 100 is further provided with a plurality of spare through electrodes 160 that pass through the first and second surfaces 111 and 112 of the semiconductor substrate 110 on the same lines as the spare bump lines 150.

Figure 2:
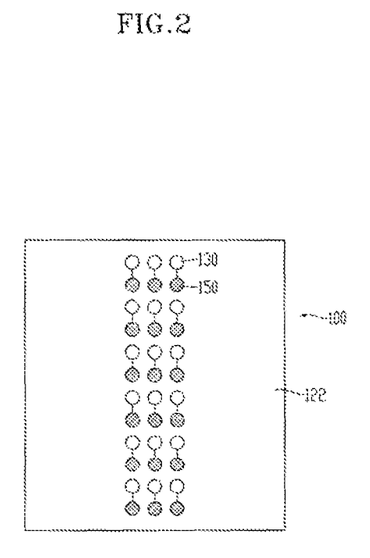
FIG. 2 is a plan view illustrating a semiconductor chip shown in FIG. 1.

Referring to FIGS. 1 and 2, the spare bumps 150 correspond one-to-one to the bumps 130 and each of the spare bumps 150 can be electrically connected with the through electrode 140 instead of its corresponding bump 130 through selective signal routing. In order to minimize the length of the signal routing path, the bump 130 and its corresponding spare bump 150 may be disposed adjacent to each other. Each of the spare through electrodes 160 may be electrically connected with the bump 130 or the spare bump 150 through the selective signal routing.

Specifically, the bump 130, the through electrode 140 formed on the same vertical line as the bump 130, the spare bump corresponding to the bump 130 and the spare through electrode 160 formed on the same vertical line as the spare bump 150 are assigned to form a single input/output line. For ease of explanation, the bump 130, the through electrode 140, the spare bump 150 and the spare through electrode 160 that are assigned to form a single input/output line will be defined as being "associated with one another."

Figure 3:
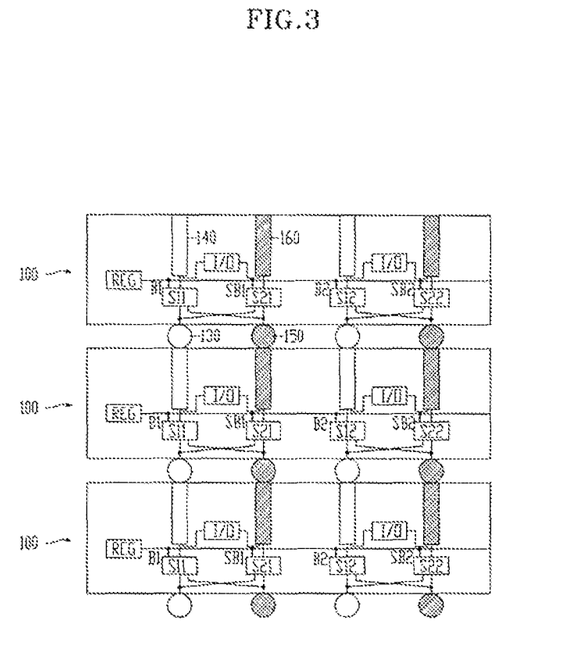
FIG. 3 is a circuit diagram illustrating a part of the stacked package shown in FIG. 1.

Referring to FIG. 3, each of the semiconductor chips 100 is provided with input/output circuits I/Os electrically connected with the through electrodes 140, and each of the through electrodes 140 is electrically connected with the integrated circuit (not shown) through the input/output circuits I/Os. The input/output circuit I/O may be understood as being an interface circuit connecting the through electrode 140 and the integrated circuit or an electrical contact between through electrode 140 and the integrated circuit.

Each of the spare through electrodes 160 is electrically connected to the same input/output circuit I/O to which its associated through electrode 140 is connected. Although the spare through electrode 160 is described and shown as being always electrically connected to the input/output circuit I/O in the present embodiment, the spare through electrode 160 may be constructed such that it is electrically connected with the input/output circuit I/O only when it is used to establish the vertical input/output line, but is not electrically disconnected with the input/output circuit I/O when it is not used to establish the vertical input/output line. To the end, a switching circuit (not shown) may be interposed between the spare through electrode 160 and the input/output circuit I/O. The switching circuit may be turned on when the spare through electrode 160 is used to establish the vertical input/output line such that it electrically connects the spare through electrode 160 with the input/output circuit I/O, but may be turned off when the spare through electrode 160 is not used to establish the vertical input/output line such that it electrically disconnects the spare through electrode 160 from the input/output circuit I/O.

Each of the semiconductor chips 100 is provided with first selecting parts S11, S12 . . . between the through electrodes 140 and their associated bump 130 and spare bump 150, thereby allowing selection of the signal routing path connecting the through electrode 140 with the bump 130 or the signal routing path connecting the through electrode 140 with the spare bump 150.

Each of the semiconductor chips 100 is further provided with second selecting parts S21, S22 . . . between the spare through electrode 160 and its associated bump 130 and spare bump 150, thereby allowing selection of the signal routing path connecting the spare through electrode 160 with the bump 130 or the signal routing path connecting the spare through electrode 160 with the spare bump 150.

Selection signal storage part REG may provide selection signals B1, B2 . . . to the first selecting parts S11, S12 . . . , and selection signals SB1, SB2 . . . to the second selecting parts S21, S22 . . . . Each of the first selecting parts S11, S12 . . . may select one of the selectable signal routing paths, i.e. the signal routing path connecting the through electrode 140 with the bump 130 or the signal routing path connecting the through electrode 140 with the spare bump 150, in accordance with the selection signals B1, B2 . . . provided from the selection signal storage part REG. Similarly, Each of the second selecting parts S21, S22 . . . may select one of the selectable signal routing paths, i.e. the signal routing path connecting the spare through electrode 160 with the bump 130 or the signal routing path connecting the spare through electrode 160 with the spare bump 150, in accordance with the selection signals SB1, SB2 . . . provided from the selection signal storage part REG.

The first selecting parts S11, S12 . . . and the second selecting parts S21, S22 . . . may consist of multiplexers, and the selection signal storage part REG may be formed of a register. Though not shown, the input/output circuit I/O, the first and second selection parts S11, S12 . . . , S21, S22 . . . and the selection signal storage part REG may be formed in the circuit layer 120.

Information on a fail bump may be stored in a memory provided within the semiconductor chip 100 or stored in a separate document, e.g. a wafer map, provided outside the semiconductor chip 100. After the semiconductor chips 100 are stacked, the selection signals B1, B2 . . . , SB1, SB2 . . . of the selection signal storage part REG may be set based on the fail bump information stored in the memory or the external document.

Figure 4A:
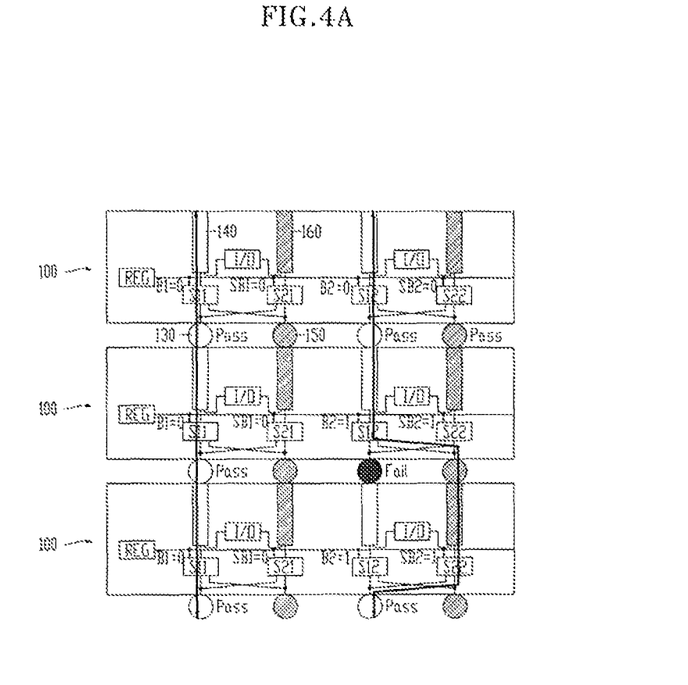
FIGS. 4A and 4B are views illustrating example cases where a fail bump is replaced by a spare bump in the stacked package shown in FIG. 1.

For example, as shown in FIG. 4A, the selection signals B1, B2 . . . , SB1, SB2 . . . may be set such that only the failed bump is replaced by its corresponding spare bump. Here, the case where the selection signals B1, B2 . . . , SB1, SB2 are '0' means that the signal routing path connecting the bump 130 with the through electrode 140 or the signal routing path connecting the spare bump 150 with the spare through electrode 160 is selected, and the case where the selection signals B1, B2 . . . , SB1, SB2 are '1' means that the signal routing path connecting the bump 130 with the spare through electrode 160 or the signal routing path connecting the spare bump 150 with the through electrode 140 is selected.

Figure 4B:
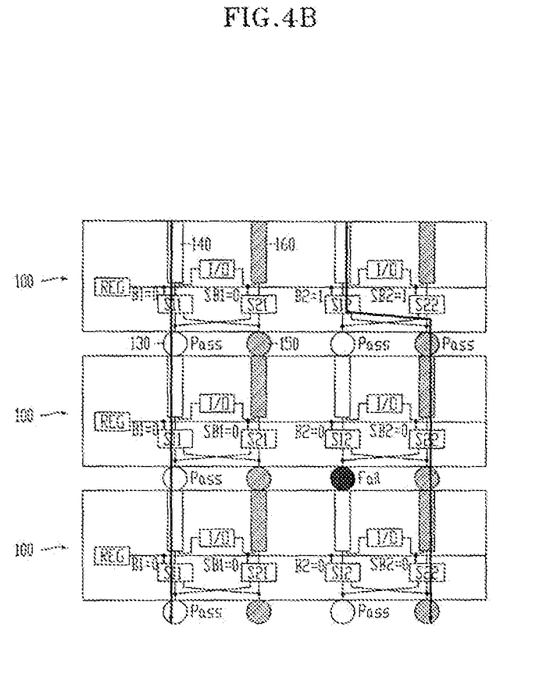

Alternatively, as shown in FIG. 4B, the selection signals B1, B2 . . . , SB1, SB2 . . . may be set such that entire bumps 130 on the vertical input/output line on which the fail bump is present are replaced by their corresponding spare bumps 150.

Although the present embodiment is described and shown for the case where the spare bumps 150 correspond one-to-one to the bumps 130 such that the number of the spare bumps 150 is identical to the number of the bumps 130, the spare bumps 150 may be formed such that the number of the spare bumps 150 is smaller than the number of the bumps 130. This alternative construction will be more appreciated from the following embodiments described with reference to FIGS. 5 to 11.

Figure 5:
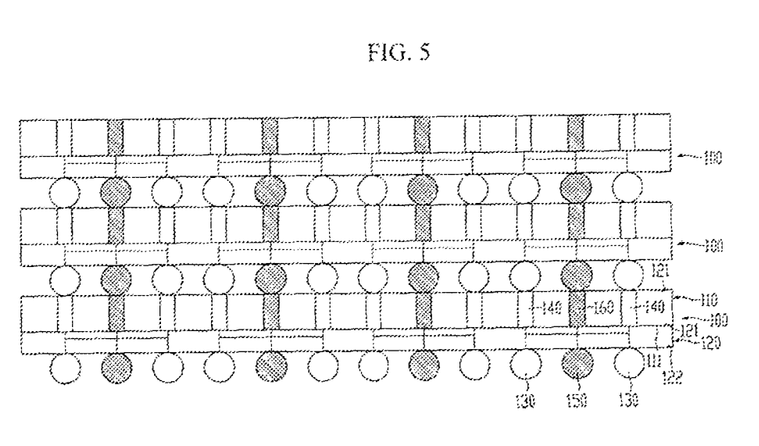
FIG. 5 is a cross-sectional view illustrating a stacked package in accordance with an embodiment of the present disclosure.
Figure 6:
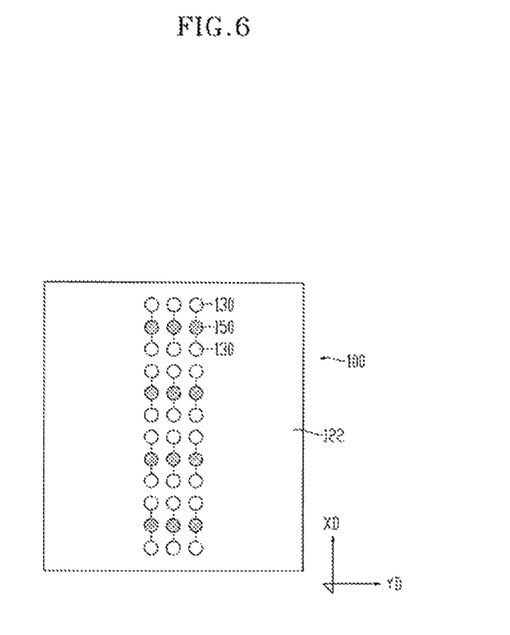
FIG. 6 is a plan view illustrating a semiconductor chip shown in FIG. 5.

Referring to FIGS. 5 and 6, a stacked package in accordance with an embodiment of the present disclosure has, unlike the stacked package of FIGS. 1 to 4B, a structure in that two bumps 130 correspond to a single spare bump 150 and, when viewed in a plan view, the two bumps 130 corresponding to the single spare bump 150 are disposed in line in a major axis direction (XD) with interposition of the spare bump 150 therebetween. In order to minimize the length of the signal routing path, the spare bump 150 and its corresponding bumps 130 may be disposed adjacent to one another. FIG. 6 also illustrates a minor axis direction (YD).

Each of the spare bumps 150 may be electrically connected in replacement of one of the two bumps 130 with the through electrode 140 formed on the same vertical line as the bump 130 to be replaced. Further, each of the spare through electrodes 160 may be electrically connected with any one of a spare bump 150 formed on the same vertical line as the spare through electrode 160, and two bumps 130 corresponding to the spare bump 150 through selective signal routing.

Figure 7:
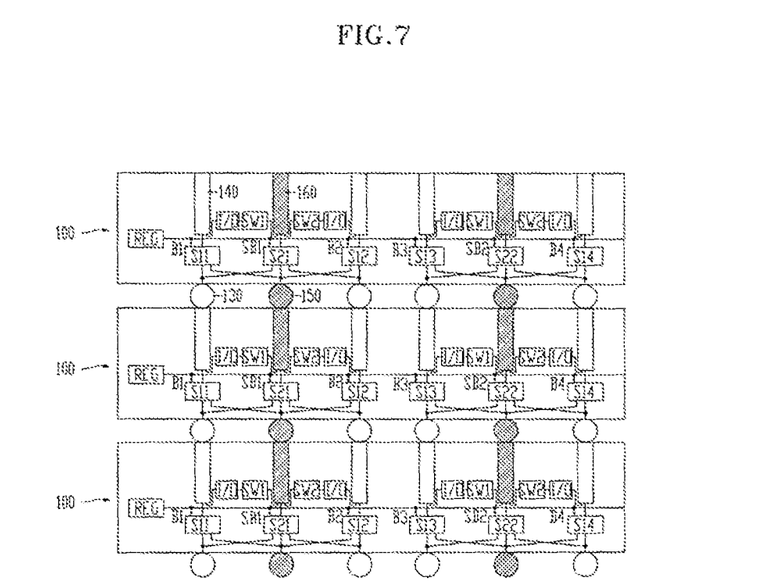
FIG. 7 is a circuit diagram illustrating a part of the stacked package shown in FIG. 5.

Referring to FIG. 7, each of the semiconductor chips 100 is provided with input/output circuits I/O electrically connected with the through electrodes 140, and each of the through electrodes 140 is electrically connected with the integrated circuit (not shown) through the input/output circuits I/O. The input/output circuit I/O may be understood as being an interface circuit connecting the through electrode 140 and the integrated circuit or an electrical contact between through electrode 140 and the integrated circuit.

Each of the spare through electrodes 160 may be electrically connected to the same input/output circuit I/O to which its associated through electrodes 140 are connected. In order to prevent a single spare through electrode 160 from being connected to two different input/output circuits I/Os at the same time, first and second switching circuits SW1 and SW2 may be interposed between the spare through electrode 160 and the input/output circuits I/Os. When the spare through electrode 160 is used to establish the vertical input/output line in replacement of its left side through electrode 140, the first switching circuit SW1 is turned on and the second switching circuit SW2 is turned off. When the spare through electrode 160 used to establish the vertical input/output line in replacement of its right side through electrode 140, the first switching circuit SW1 is turned off and the second switching circuit SW2 is turned on. If the spare through electrode is not used to form the vertical input/output line, both the first and second switching lines SW1 and SW2 are turned off.

Each of the semiconductor chips 100 is provided with first selecting parts S11, S12, S13, S14 . . . between the through electrodes 140 and their associated bump 130 and spare bump 150, thereby allowing selection of the signal routing path connecting the through electrode 140 with the bump 130 or the signal routing path connecting the through electrode 140 with the spare bump 150. Each of the semiconductor chips 100 is further provided with second selecting parts S21, S22 . . . between the spare through electrodes 160 and their associated two bumps 130 and spare bump 150, thereby allowing selection of the signal routing path connecting the spare through electrode 160 with the two bumps 130 or the signal routing path connecting the spare through electrode 160 with the spare bump 150.

Selection signal storage part REG may provide selection signals B1, B2, B3, B4 . . . to the first selecting parts S11, S12, S13, S14 . . . , and selection signals SB1, SB2 . . . to the second selecting parts S21, S22 . . . . Each of the first selecting parts S11, S12, S13, S14 . . . may select one of the selectable signal routing paths, i.e. the signal routing path connecting the through electrode 140 with the bump 130 or the signal routing path connecting the through electrode 140 with the spare bump 150, in accordance with the selection signals B1, B2, B3, B4 . . . provided from the selection signal storage part REG. Similarly, Each of the second selecting parts S21, S22 . . . may select one of the selectable signal routing paths, i.e. the signal routing path connecting the spare through electrode 160 with the two bumps 130 or the signal routing path connecting the spare through electrode 160 with the spare bump 150, in accordance with the selection signals SB1, SB2 . . . provided from the selection signal storage part REG.

The first selecting parts S11, S12, S13, S14 . . . and the second selecting parts S21, S22 . . . may consist of multiplexers, and the selection signal storage part REG may be formed of a register. Though not shown, the input/output circuit I/O, the first and second selection parts S11, S12, S13, S14 . . . , S21, S22 . . . and the selection signal storage part REG may be formed in the circuit layer 120.

When a single spare bump 150 is assigned to two bumps 130 as is in the present embodiment, the spare bumps 150 present on the same vertical line can replace the bumps 130 present on different vertical lines.

Figure 8:
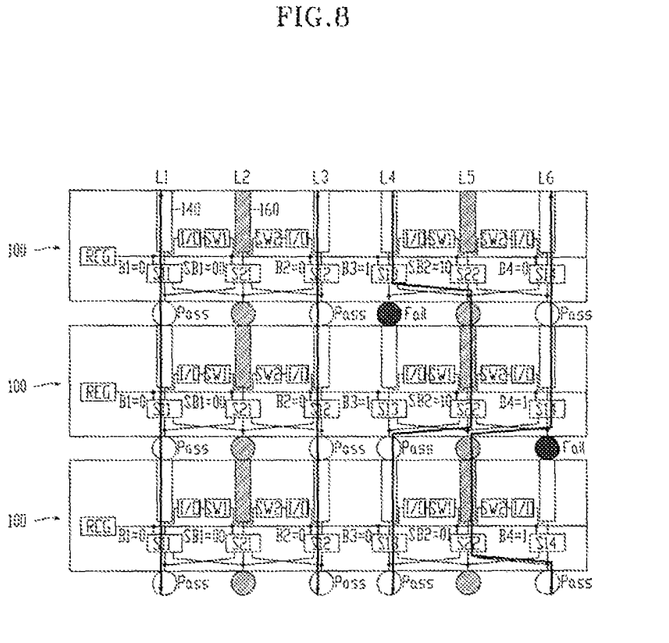
FIG. 8 is a view illustrating an example case in which a fail bump is replaced by a spare bump in the stacked package shown in FIG. 5.

For example, as shown in FIG. 8, when the bump 130 located on the fourth line L4 (i.e., out of first to sixth lines L1 to L6) of the uppermost semiconductor chip 100 and the bump 130 located on the sixth line L6 of the middle semiconductor chip 100 are failed, the spare bump located on the fifth line L5 of the uppermost semiconductor chip 100 may replace the bump located on the fourth line L4 of the uppermost semiconductor chip 100 and the spare bump located on the fifth line L5 of the middle semiconductor chip 100 may replace the bump located on the sixth line L6 of the middle semiconductor chip 100. In other words, the spare bumps 150 located on the fifth line L5 may replace the bumps 130 located on the fourth and sixth lines L4 and L6. In FIG. 8, the case where the selection signals B1, B2, B3, B4 . . . inputted to the first selecting parts S11, S12, S13, S14 . . . are '0' means that the signal routing path connecting the through electrode 140 with the bump 130 is selected, and the opposite case where the signals are '1' means that the signal routing path connecting the through electrode 140 with the spare bump 150 is selected. Further, the case where the selection signals SB1, SB2 . . . inputted to the second selecting parts S21, S22 . . . are '00' means that the signal routing path connecting the spare through electrode 160 with the spare bump 150, the case where the signals are '10' means that the signal routing path connecting the spare through electrode 160 with the bump 130 on the left side line is selected, and the case where the signals are '01' means that the signal routing path connecting the spare through electrode 160 with the bump 130 on the right side line is selected. In order to minimize the length of the signal routing path, the corresponding bump 130 and spare bump 150 may be disposed adjacent to each other.

With the present embodiment, since the number of the spare bumps 150 is half of the number of the bumps 130, the area occupied by the spare bumps 150 is decreased, limiting the increase in chip size with regards to the issues relating to the increase in chip size due to spare bumps 150 or spare through electrodes 160.

Figure 9:
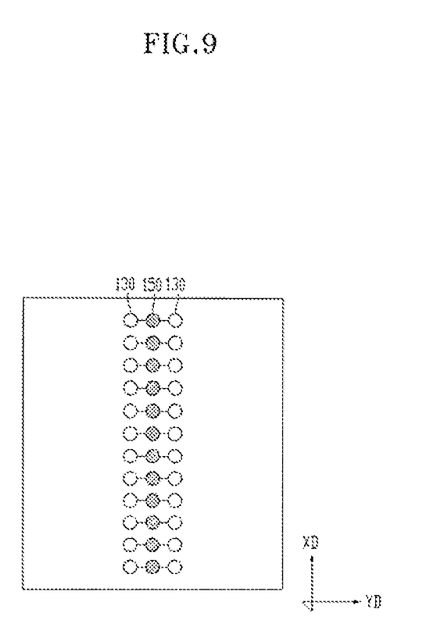
FIGS. 9 to 11 are plan views illustrating various arrangements of bumps and spare bumps.

Although the embodiments of FIGS. 5 to 8 are described and shown for the case where two bumps 130 correspond to a single spare bump 150 and, when viewed in a plan view, the two bumps 130 corresponding to the single spare bump 150 are disposed in line in a major axis direction (XD) with interposition of the spare bump 150 therebetween, there are other alternative embodiments as shown in FIG. 9. For example, when viewed in a plan view, two bumps 130 corresponding to a single spare bump 150 are disposed in line in a minor axis direction (YD) with interposition of the spare bump 150 therebetween.

Figure 10:
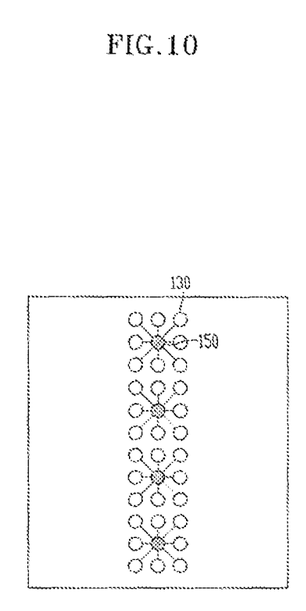

With other alternative embodiments as shown in FIG. 10, eight bumps 130 may be assigned to a single spare bump 150 and the eight bumps 130 assigned to the single spare bump 150 may be radially disposed about the single spare bump 150. In this case, since a large number of the bumps 130 are assigned to a single spare bump, the number of the total spare bumps 150 can be greatly reduced. Therefore, minimizing the issue of increasing chip sizes with relation to having spare bumps 150 and spare through electrodes 160. Although not shown in FIG. 10 there may be more or less than eight bumps 130 surrounding a spare bump 150, as the embodiments are not limited in this manner.

Figure 11:
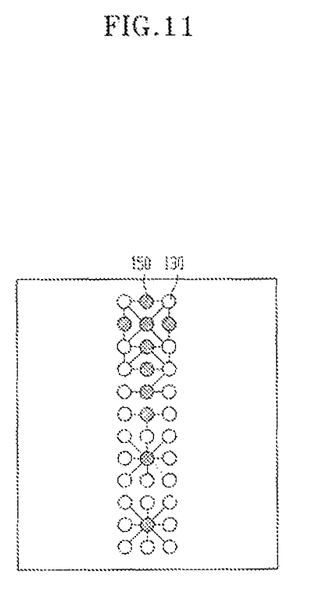

With other embodiments, as shown in FIG. 11, the spare bumps 150 may be disposed dispersively in a region which is predicted as having a low failure rate, and may be disposed with more concentration in a region which is predicted as having a high failure rate.

With the various embodiments, when a bump is failed, the vertical input/output line may be established through a spare bump instead of the failed bump, thus the semiconductor chip and the stacked package having any failed bump or bumps may not be discarded but may be reusable, resulting in an increase in yield.

The stacked package in accordance with various embodiments may be applied to a variety of electronic systems and electronic apparatuses.

Figure 12:
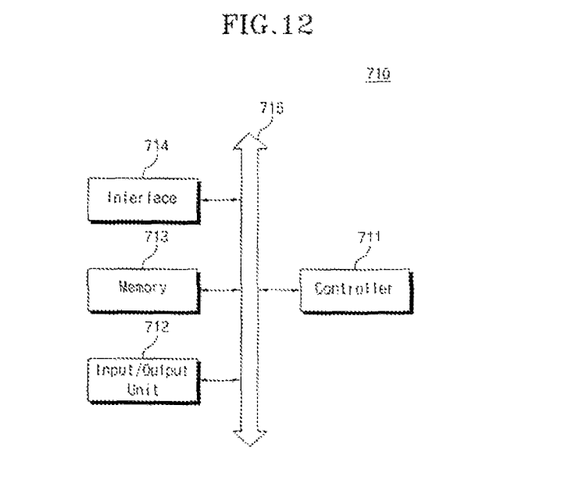
FIG. 12 is a block diagram showing an electronic system to which the stacked package in accordance with various embodiments of the present disclosure is applied.

Referring to FIG. 12, the stacked package in accordance with various embodiments may be applied to an electronic system. The electronic system 710 may include a controller 711, an input/output unit 712, and a memory 713. The controller 711, the input/output unit 712 and the memory 713 may be coupled with one another through a bus 715, which serves as a path through which data move.

The controller 711 may include at least any one of the following: one or more microprocessors, one or more digital signal processors, one or more microcontrollers, and logic devices capable of performing the same functions as these components. The input/output unit 712 may include at least one selected among a keypad, a keyboard, a display device, and so forth.

The memory 713 may include the stacked package according to various embodiments of the present disclosure. The memory 713 may store data and/or commands to be executed by the controller 711 and the like. The memory 713 may include a volatile memory device and/or a nonvolatile memory device, such as a flash memory. For example, a flash memory to which the technology of the present disclosure is applied may be mounted to an information processing system such as a mobile terminal or a desktop computer. The flash memory may be constituted by a solid state drive (SSD). In this case, the electronic system 710 may stably store a large amount of data in a flash memory system.

The electronic system 710 may further include an interface 714 configured to transmit and receive data to and from a communication network. The interface 714 may be a wired or wireless type. For example, the interface 714 may include an antenna or a wired (or wireless) transceiver. The interface 714 may be coupled to the memory 713, the input/output unit 712 and the controller 711 through the bus 715.

The electronic system 710 may be realized as a mobile system, a personal computer, an industrial computer or a logic system performing various functions. For example, the mobile system may be any one of a personal digital assistant (PDA), a portable computer, a web tablet, a mobile phone, a smart phone, a wireless phone, a laptop computer, a memory card, a digital music system and an information transmission/reception system.

In the case where the electronic system 710 is an equipment capable of performing wireless communication, the electronic system 710 may be used in a communication system such as of CDMA (code division multiple access), GSM (global system for mobile communication), NADC (north American digital cellular), E-TDMA (enhanced-time division multiple access), WCDAM (wideband code division multiple access), CDMA2000, LTE (long term evolution) and Wibro (wireless broadband Internet).

Figure 13:
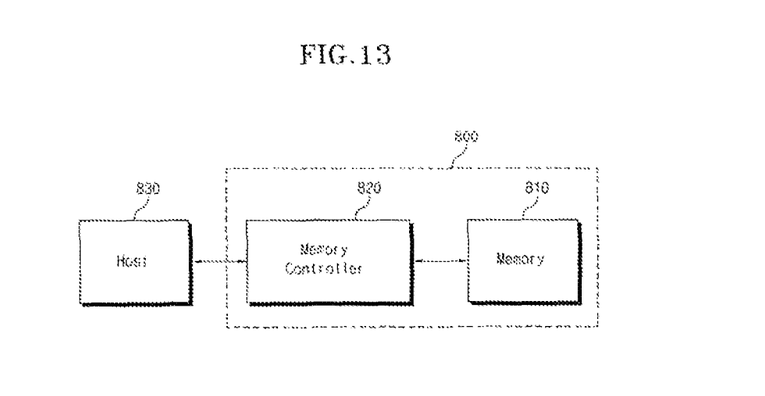
FIG. 13 is a block diagram illustrating an electronic apparatus which may include the stacked package in accordance with various embodiments of the present disclosure.

Referring to FIG. 13, the stacked package in accordance with various embodiments may be provided in the form of a memory card 800. For example, the memory card 800 may include a memory 810 such as a nonvolatile memory device and a memory controller 820. The memory 810 and the memory controller 820 may store data or read stored data.

The memory 810 may include the stacked package in accordance with various embodiments of the present disclosure. The memory controller 820 may control the memory 810 such that stored data is read out or data is stored in response to a read/write request from a host 830.

While the present disclosure has been described with respect to the specific embodiments, it will be apparent to those skilled in the art that various changes and modifications may be made without departing from the spirit and scope of the invention as defined in the following claims.

What is claimed is:

1. A semiconductor chip, comprising:
    a semiconductor substrate;
    a circuit layer formed over the semiconductor substrate;
    a bump formed over the circuit layer;
    a spare bump formed correspondingly to the bump and over the circuit layer, and configured for replacing the bump with the spare bump;
    a through electrode configured to pass through the semiconductor substrate on a same line as the bump and electrically couple with the bump or the spare bump in response to a selection signal;
    a spare through electrode configured to pass through the semiconductor substrate on a same line as the spare bump and electrically couple with the spare bump or the bump in response to the selection signal;
    a selection signal storage part configured for providing the selection signal; and
    a memory configured to store information on a fail bump, wherein the selection signal storage part sets the selection signals based on the stored fail bump information.

2. The semiconductor chip of claim 1, further comprising:
    a first selecting part configured for selecting one of a signal routing path that connects the through electrode with the bump and a signal routing path that connects the through electrode with the spare bump; and
    a second selecting part configured for selecting one of a signal routing path that connects the spare through electrode with the bump and a signal routing path that connects the spare through electrode with the spare bump,
    wherein the first and second selecting parts select the signal routing path according to the selection signal.

3. The semiconductor chip of claim 2, wherein the first and second selecting parts include a multiplexer.

4. The semiconductor chip of claim 1, wherein the selection signal storage part includes a register.

5. The semiconductor chip of claim 1, wherein each of the spare bumps correspond one-to-one with the bumps.

6. The semiconductor chip of claim 1, wherein each of the spare bumps correspond to two or more bumps.

7. The semiconductor chip of claim 1, wherein the bump and the corresponding spare bump are disposed adjacent to each other.

8. A stacked package, comprising:
    a plurality of semiconductor chips including: a semiconductor substrate, a circuit layer formed over the semiconductor substrate, a bump formed over the circuit layer, a spare bump formed correspondingly to the bump and over the circuit layer, and configured for replacing the bump with the spare bump, a through electrode configured to pass through the semiconductor substrate on a same line as the bump and electrically couple with the bump or the spare bump by selective signal routing, a spare through electrode configured to pass through the semiconductor substrate on a same line as the spare bump and electrically couple with the bump or the spare bump by selective signal routing, a selection signal storage part configured for providing the selection signal, and a memory configured to store information on a fail bump, wherein the selection signal storage part sets the selection signals based on the stored fail bump information,
    wherein when a bump fails, a vertical input/output line of the semiconductor chips is established by a spare bump corresponding to the failed bump through the selective signal routing.

9. The stacked package of claim 8, wherein each of the semiconductor chips further includes:
    a first selecting part configured for selecting one of a signal routing path that connects the through electrode with the bump and a signal routing path that connects the through electrode with the spare bump; and
    a second selecting part configured for selecting one of a signal routing path that connects the spare through electrode with the bump and a signal routing path that connects the spare through electrode with the spare bump;
    wherein the first and second selecting parts select the signal routing path according to the selection signal.

10. The stacked package of claim 9, wherein the first and second selecting parts include a multiplexer.

11. The stacked package of claim 8, wherein the selection signal storage part includes a register.

12. The stacked package of claim 8, wherein each of the spare bumps correspond one-to-one with the bumps.

13. The stacked package of claim 8, wherein each of the spare bumps correspond to two or more bumps.

14. The stacked package of claim 8, wherein the bump and the corresponding spare bump of each of the semiconductor chips are disposed adjacent to each other.

15. The stacked package of claim 8, wherein only the failed bump is replaced by the corresponding spare bump, and the other bumps located on the same line as the failed bump are not replaced by their corresponding spare bumps.

16. The stacked package of claim 8, wherein all of the bumps located on the same line as the failed bump are replaced by their corresponding spare bumps.

17. An electronic system comprising:
    a memory; and
    a controller configured to communicate with the memory through a bus,
    wherein the memory includes a stacked package, comprising:
    a plurality of semiconductor chips including: a semiconductor substrate, a circuit layer formed over the semiconductor substrate, a bump formed over the circuit layer, a spare bump formed correspondingly to the bump and over the circuit layer, and configured for replacing the bump with the spare bump, a through electrode configured to pass through the semiconductor substrate on a same line as the bump and electrically couple with the bump or the spare bump by selective signal routing, a spare through electrode configured to pass through the semiconductor substrate on a same line as the spare bump and electrically couple with the bump or the spare bump by selective signal routing, a selection signal storage part configured for providing the selection signal, and a memory element configured to store information on a fail bump, wherein the selection signal storage part sets the selection signals based on the stored fail bump information,
    wherein when a bump fails, a vertical input/output line of the semiconductor chips is established by a spare bump corresponding to the failed bump through the selective signal routing.

* * * * *